(12) United States Patent
Wang et al.

(10) Patent No.: US 9,136,164 B2
(45) Date of Patent: Sep. 15, 2015

(54) SEMICONDUCTOR DEVICE AND FABRICATION METHOD

(71) Applicant: Semiconductor Manufacturing International (Shanghai) Corporation, Shanghai (CN)

(72) Inventors: Xinpeng Wang, Shanghai (CN); Weihai Bu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/530,856

(22) Filed: Nov. 3, 2014

(65) Prior Publication Data

US 2015/0187633 A1    Jul. 2, 2015

(30) Foreign Application Priority Data

Dec. 27, 2013   (CN) .......................... 2013 1 0739057

(51) Int. Cl.
*H01L 23/12*    (2006.01)
*H01L 21/768*    (2006.01)
*H01L 23/48*    (2006.01)

(52) U.S. Cl.
CPC ...... *H01L 21/7682* (2013.01); *H01L 21/76802* (2013.01); *H01L 21/76843* (2013.01); *H01L 23/481* (2013.01)

(58) Field of Classification Search
None
See application file for complete search history.

(56) References Cited

U.S. PATENT DOCUMENTS

| | | | | |
|---|---|---|---|---|
| 6,291,272 | B1 * | 9/2001 | Giri et al. | 438/121 |
| 8,822,266 | B2 * | 9/2014 | Smeys et al. | 438/106 |
| 2004/0231141 | A1 * | 11/2004 | Nishinaka et al. | 29/609 |
| 2008/0289866 | A1 * | 11/2008 | Yuri et al. | 174/260 |

\* cited by examiner

*Primary Examiner* — Bilkis Jahan
(74) *Attorney, Agent, or Firm* — Anova Law Group, PLLC

(57) ABSTRACT

Semiconductor devices and fabrication methods are provided. First metal layers are provided in a substrate including a first region and a second region. An interlayer dielectric (ILD) layer formed over the substrate includes a top surface in the second region coplanar with a bottom of a trench in the ILD layer in the first region. Through-holes are formed in the ILD layer. A polymer layer fills the through-holes and the trench in ILD layer and covers top surface of ILD layer in both regions. The polymer layer is exposed and developed to form vias, each including an upper via in the polymer layer and a lower via in ILD layer. A second metal layer is formed to fill each via on a corresponding first metal layer in both regions. The polymer layer between adjacent second metal layers is removed to form air gaps in the second region.

20 Claims, 4 Drawing Sheets

SEMICONDUCTOR DEVICE AND FABRICATION METHOD

CROSS-REFERENCES TO RELATED APPLICATIONS

This application claims priority to Chinese Patent Application No. CN201310739057.9, filed on Dec. 27, 2013, the entire content of which is incorporated herein by reference.

FIELD OF THE DISCLOSURE

The present disclosure relates to the field of semiconductor manufacturing technology and, more particularly, relates to semiconductor devices and fabrication methods.

BACKGROUND

With rapid development of semiconductor manufacturing technology, semiconductor chips are manufactured with high degree of integration to provide fast computing speed, great data storage capacity, and more functions. High integration degree of a semiconductor chip can provide semiconductor devices in the semiconductor chip with small critical dimensions (CDs).

When CDs of semiconductor devices are increasingly smaller, distance between adjacent interconnect structures become smaller. Consequently, capacitance between adjacent interconnect structures increases. Such capacitance is also known as parasitic capacitance. Parasitic capacitance may affect RC delay effect of the semiconductor devices and thus affect operating speed of the semiconductor chip along with reliability of the semiconductor devices in the semiconductor chip.

Conventional methods for solving problems due to parasitic capacitance include using materials with low dielectric constant to replace materials (e.g., silicon oxide) with high dielectric constant as an interlayer dielectric layer and/or a dielectric layer between metal layers to reduce capacitance between adjacent interconnect structures.

However, semiconductor devices formed by conventional methods still have parasitic capacitance problems. At certain points, RC delay effects may still cause slow operating speed and poor reliability of the semiconductor devices.

BRIEF SUMMARY OF THE DISCLOSURE

According to various embodiments, there is provided a method for forming a semiconductor device. First metal layers are provided in a substrate including a first region and a second region. The first metal layers have a top surface coplanar with a top surface of the substrate. An interlayer dielectric layer is formed over the substrate, and includes a trench in the first region and includes a top surface in the second region coplanar with a bottom of the trench in the first region. Through-holes are formed in the interlayer dielectric layer, each through-hole corresponding to one first metal layer in the first region and the second region.

A polymer layer is formed to fill the through-holes and trench in the interlayer dielectric layer and to cover the top surface of the interlayer dielectric layer in the first and second regions. The polymer layer has a different solubility in an exposed area and in a non-exposed area. The polymer layer is exposed and developed to form vias, each including an upper via in the polymer layer and a lower via in the interlayer dielectric layer. Each via is formed on a corresponding first metal layer in the first and second regions. A second metal layer is formed to fill each via and to electrically connect to the corresponding first metal layer. The polymer layer between adjacent second metal layers is removed to form air gaps between the adjacent second metal layers in the second region.

According to various embodiments, there is also provided a semiconductor device including a substrate having a first region and a second region. First metal layers are disposed in the first and second regions. The first metal layers have a top surface coplanar with a top surface of the substrate. An interlayer dielectric layer is disposed over the substrate. Second metal layers are disposed on corresponding first metal layers in the first and second regions. Each second metal layer has a lower metal layer through the interlayer dielectric layer and an upper metal layer protruded over and disposed on a top surface of the interlayer dielectric layer.

Air gaps are formed between adjacent second metal layers in the second region by: forming through-holes in the interlayer dielectric layer, each through-hole corresponding to one first metal layer in the first region and the second region. The interlayer dielectric layer further includes a trench in the first region. A polymer layer is formed to fill the through-holes and the trench in the interlayer dielectric layer and to cover the top surface of the interlayer dielectric layer in the first and second regions. The polymer layer has a different solubility in an exposed area and in a non-exposed area, and is then exposed and developed the polymer layer to form vias. Each via includes an upper via in the polymer layer and a lower via in the interlayer dielectric layer, and each via is formed on a corresponding first metal layer in the first and second regions. A second metal layer fills each via and electrically connects to the corresponding first metal layer. The polymer layer between adjacent second metal layers is then removed to form air gaps between the adjacent second metal layers in the second region.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Semiconductor devices formed by conventional methods may have parasitic capacitance problems such as RC delay effects, which may cause slow operating speed and poor reliability of the semiconductor devices. Parasitic capacitance can be proportional to dielectric constant k of a semiconductor device. Lowering the k value of an interlayer dielectric layer and/or a dielectric layer between metal layers may reduce parasitic capacitance of the semiconductor device. Ideally, the dielectric constant k of the interlayer dielectric layer and the dielectric layer between metal layers can be reduced to about 1.0, which is the dielectric constant of vacuum. The dielectric constant of air is about 1.001, close to that of the vacuum.

An air gap can be formed between interconnect structures of a semiconductor device to effectively reduce parasitic capacitance of the semiconductor device and to improve RC delay effect, operating speed, and reliability of the semiconductor device.

Figure 1:
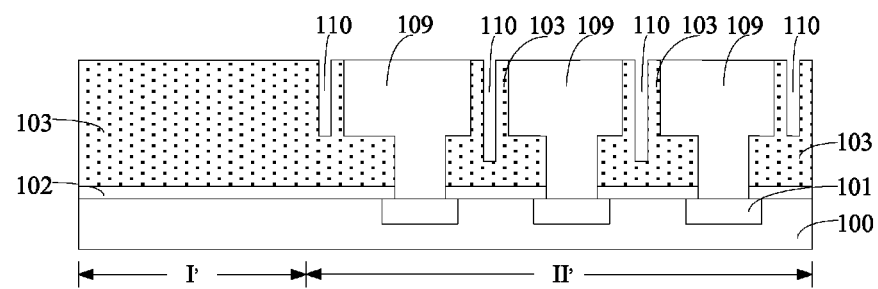
FIG. 1 depicts a semiconductor device including air gaps.

FIG. 1 depicts a semiconductor device including air gaps. As shown in FIG. 1, semiconductor substrate 100 is provided and includes a first region I' and a second region II'. In the second region II', first metal layers 101 can be formed in the semiconductor substrate 100. Etch stop layer 102 is formed on surface of semiconductor substrate 100. Interlayer dielectric layer 103 is formed on surface of etch stop layer 102. Openings are formed in interlayer dielectric layer 103 by an etching process performed in the second region II', followed by filling the openings with metals to form second metal layers 109. Air gaps 110 are then formed in interlayer dielectric layer 103 between adjacent second metal layers 109.

Air gaps 110 are formed by a photolithographic process using a patterned photoresist layer (not shown). For example, the patterned photoresist layer can be formed on interlayer dielectric layer 103. The patterned photoresist layer can have openings corresponding to air gaps 110 to be formed in interlayer dielectric layer 103 and can be used as an etch mask in an etching process for forming air gaps 110 in interlayer dielectric layer 103.

Air gaps 110 formed in interlayer dielectric layer 103 as shown in FIG. 1, however, has a small feature size (or critical dimension). The formed semiconductor device can thus have a small area of air gaps, which may have limited air-gap effect on effectively reducing k value of the semiconductor device. RC delay effect of the semiconductor device may still occur and operating speed of the semiconductor device may need to be improved.

In addition, air gaps 110 are formed in interlayer dielectric layer 103 by a photolithographic process. Overlay errors may occur to the openings in the patterned photoresist layer after the etching process for forming the openings. To avoid undesired etching of second metal layer 109 caused by the overlay errors (or misalignment) when forming air gaps 110, the patterned photoresist layer has to be formed to provide a sufficient distance between second metal layers 109 to provide a sufficient window for the patterning and etching processes in interlayer dielectric layer 103. Further, interlayer dielectric layer 103 between air gap 110 and second metal layer 109 can take up a certain width/area, which in turn results in small air gaps.

In various embodiments, air gaps can be formed by completely removing interlayer dielectric layer between adjacent second metal layers such that the feature size of an air gap can be can be significantly increased. Dielectric constant k value of the formed semiconductor device can thus be effectively reduced. RC delay effect can be improved and operating speed of the semiconductor device can be increased.

For example, through-holes can be formed through an interlayer dielectric layer on a substrate surface. A polymer layer can be formed in the through-holes and on surface of the interlayer dielectric layer. Vias can be formed in the polymer layer and the interlayer dielectric layer. By annealing remaining polymer layer after forming the vias, the polymer layer can be oxidized into an oxide layer. A second metal layer can be formed by filling the vias with metal material(s). The oxide layer between adjacent second metal layers can then be completely removed to form air gaps. As such, the air gaps can have large feature sizes to effectively reduce the k value of the semiconductor device. RC delay effect can be improved and operating speed of the semiconductor device can be increased. In addition, the manufacturing process is simplified.

FIGS. 2-10 depict cross-sectional views of an exemplary semiconductor device at various stages during its formation in accordance with various disclosed embodiments.

Figure 2:
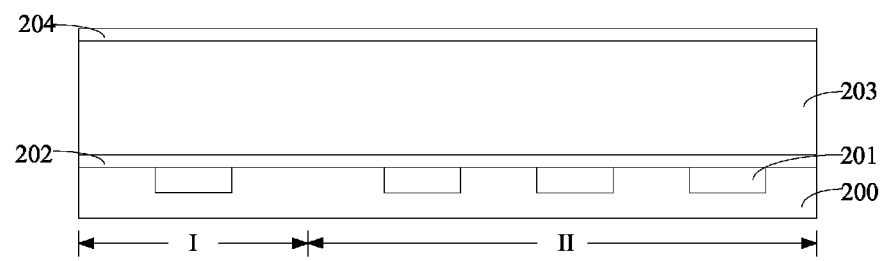
FIGS. 2-10 depict cross-sectional views of an exemplary semiconductor device at various stages during formation in accordance with various disclosed embodiments.

Referring to FIG. 2, substrate 200 is provided. Substrate 200 includes a first region I and a second region II. First metal layers 201 are formed in the first and second regions of substrate 200. First metal layers 201 can have a top surface coplanar with a top surface of substrate 200 (e.g., in Step 1102).

Substrate 200 can provide a platform for subsequent processes of forming a semiconductor device. Substrate 200 can be made of a material including silicon, polycrystalline silicon, or amorphous silicon. In some cases, substrate 200 can be made of a material including a silicon germanium compound, or silicon-on-insulator (SOI). In one embodiment, semiconductor devices, such as MOS transistors, can be made within substrate 200. In an exemplary embodiment, substrate 200 can be a silicon substrate.

The first region I and the second region II can be positioned or arranged interchangeably and/or can be positioned adjacently or separately, e.g., in a whole wafer. The first region I and the second region II of substrate 200 can be used to define areas in substrate 200 for forming or not-forming air gaps.

For example, the first region I and the second region II can be positioned adjacent with one another, while air gaps are formed in the second region II and no air gaps are formed in the first region I, as shown in FIGS. 2-10. In some embodiments, substrate 200 can include the first region I and the second region II each containing air gaps formed therein (not illustrated). In other embodiments, substrate 200 can only include an area for forming air gaps (not illustrated).

First metal layers 201 can be electrically connected to interconnect structures to be formed subsequently. In various embodiments, first metal layers 201 can be used to electrically connect the interconnect structures to be formed subsequently with an external circuit or other metal layer(s). First metal layers 201 can be made of a material including Cu, Al, W, and/or any suitable conductive material(s).

Note that any number (e.g., one, two, four, eight, etc.) of first metal layers 201 can be included in the exemplary regions of substrate 200, although FIG. 2 shows one first metal layer in the first region I and three first metal layers in the second region II of substrate 200 for illustration purposes.

In the embodiment when air gaps are formed in the second region II and no air gaps are formed in the first region I, first metal layers 201 arranged in the second region II can have a density greater than those arranged in the first region I. Accordingly, second metal layers subsequently formed on first metal layers 201 in the second region II can have a density greater than those arranged in the first region I. While air gaps are to be formed between adjacent densely-arranged second metal layers in the second region II, less-densely-arranged second metal layers in the first region I can also be formed, e.g., surrounding the second region II, to provide a physical stand-up strength for the semiconductor device. In one embodiment, the second metal layers subsequently formed in the first region I can include ISO (isolated, as opposed to "dense") copper line structures, compared with dense copper line structures formed in the second region II.

Still referring to FIG. 2, interlayer dielectric layer 203 can be formed on the top surface of substrate 200 (e.g., in Step 1104). Optionally, protective layer 204 can be formed on surface of interlayer dielectric layer 203.

Interlayer dielectric layer 203 can be made of a material including silicon dioxide, a low-k dielectric material (e.g., having a dielectric constant k less than about 3.9), or an ultra-low-k dielectric material (e.g., having a dielectric constant k less than about 2.5). In various embodiments, use of a low-k or ultra-low k dielectric material for the Interlayer dielectric layer 203 can facilitate to reduce dielectric constant of the semiconductor device and to improve the RC delay effect along with the operating speed of the semiconductor device.

Low-k dielectric material can include SiCOH, FSG (fluorine-doped silicon dioxide), BSG (boron-doped silicon dioxide), PSG (phosphorus-doped silicon dioxide), and/or BPSG (boron-doped phosphorous silica). In one embodiment, interlayer dielectric layer 203 can be made of ultra-low-k dielectric material such as SiOH.

Noted that, to prevent damage to interlayer dielectric layer 203 during subsequent removal of oxide layer formed by oxidation of a polymer layer, a material can be selected for interlayer dielectric layer 203 having an etching selectivity over the oxide layer. When the oxide layer is etched, no damages to interlayer dielectric layer 203 can occur during the etching process.

In one embodiment, etch stop layer 202 can be optionally formed between substrate 200 and interlayer dielectric layer 203. Etch stop layer 202 can be used to protect first metal layers 201 from being damaged by subsequent manufacturing processes. Etch stop layer 202 can be used as a barrier layer to prevent metal ions from being diffused from first metal layers 201, e.g., into interlayer dielectric layer 203.

Etch stop layer 202 can be made of a material including SiC, SiN, SiOC, SiCN, and/or SiOCN. Etch stop layer 202 can be formed by, e.g., chemical vapor deposition, physical vapor deposition, and/or atomic layer deposition.

In one embodiment, etch stop layer 202 can be formed by a chemical vapor deposition. Etch stop layer 202 can be made of SiCN. Etching stop layer 202 can have a thickness ranging from about 50 angstroms to about 150 angstroms. In various embodiments, interlayer dielectric layer 203 can be formed directly on the top surface of substrate 200 without forming the etch stop layer 202.

Protective layer 204 formed on the top surface of interlayer dielectric layer 203 can be used as a buffer layer between interlayer dielectric layer 203 and subsequently formed mask layer to protect interlayer dielectric layer 203. For example, protective layer 204 can be used to protect interlayer dielectric layer 203 in the first region I in subsequent manufacturing processes.

In one embodiment, protective layer 204 is a silicon layer. Protective layer 204 can have a thickness ranging from about 50 angstroms to about 200 angstroms. In another embodiment, protective layer 204 can be made of tetraethoxysilane (TEOS: $Si(OC_2H_5)_4$). In some embodiments, protective layer 204 may not be formed on interlayer dielectric layer 203.

Figure 3:
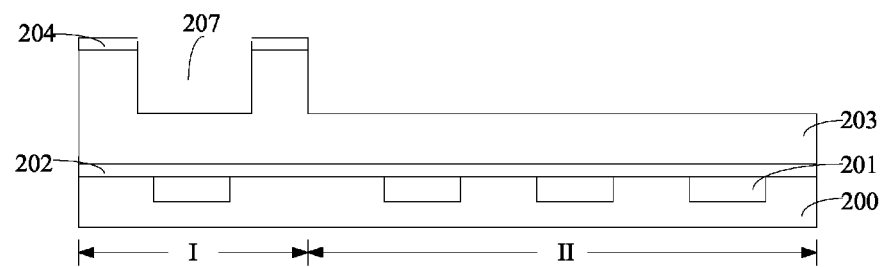

Referring to FIG. 3, protective layer 204 and a thickness portion of interlayer dielectric layer 203 in both the first and second regions can be removed to expose a remaining portion of interlayer dielectric layer 203.

As shown in FIG. 3, the remaining portion of interlayer dielectric layer 203 can include a trench 207 in the first region II, and interlayer dielectric layer 203 in the second region II can have a top surface coplanar with a bottom of trench 207 in the first region I.

To form interlayer dielectric layer 203, a patterned photoresist layer can be formed on surface of protective layer 204 as shown in FIG. 2 and can be used as an etch mask to etch protective layer 204 and interlayer dielectric layer 203 to expose the remaining portion of interlayer dielectric layer 203 in the first and second regions. In one embodiment, a dry etching process can be used for the etching process.

The remaining portion of interlayer dielectric layer 203 can have a thickness used to determine a height of through-holes to be formed through the remaining portion of interlayer dielectric layer 203. For example, the removed thickness portion of interlayer dielectric layer 203 in the second region II can provide a thickness used as a height of through-holes to be formed. In various embodiments, the thickness of the removed thickness portion of interlayer dielectric layer 203 can be determined according to specific application.

Figure 4:
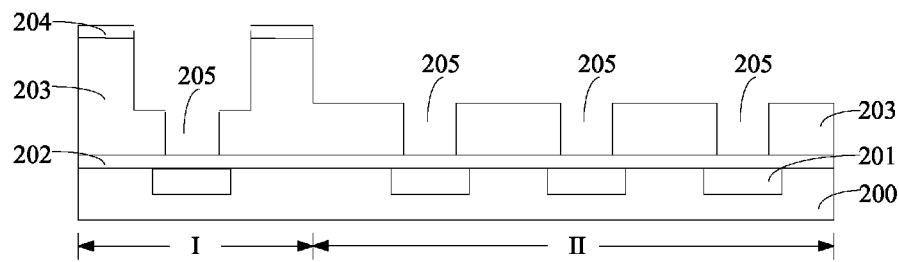

Referring to FIG. 4, the remaining portion of interlayer dielectric layer 203 can be etched to form through-holes 205 through interlayer dielectric layer 203 to expose surface portions of etch stop layer 202 (e.g., in Step 1106).

Through-holes 205 can be formed, e.g., by forming an initial mask layer (not shown) on an entire surface of the semiconductor device shown in FIG. 3, i.e., on surface of both the first region I and the second region II. A patterned photoresist layer (not shown) can then be formed on the initial mask layer. The patterned photoresist layer is patterned corresponding to through-holes to be formed in the remaining portion of interlayer dielectric layer 203. The patterned photoresist layer can be used as an etch mask to pattern and etch the initial mask layer to form a patterned initial mask layer (not shown). The patterned initial mask layer has openings corresponding to through-holes to be formed subsequently. The patterned photoresist layer can then be removed from the patterned initial mask layer, which can then be used as an etch mask to etch the remaining portion of interlayer dielectric layer 203 to form through-holes 205 in the first and second regions.

Note that although one through-hole 205 is formed in the first region I and three through-holes 205 are formed in the second region II for illustration purposes, any number of three through-holes, more or less than three, can be encompassed in the present disclosure without limitations. In one embodiment, a dry etching process can be used for forming through-holes 205 including, e.g., a plasma etching process.

Through-holes 205 can be formed in a position and having a width such that, when subsequently removing etch stop layer 202 at the bottom of through-holes 205, surfaces of first metal layers 201 can be exposed for electrical connections. In one embodiment, each through-hole 205 can be positioned in line with a corresponding first metal layer 201.

Figure 5:
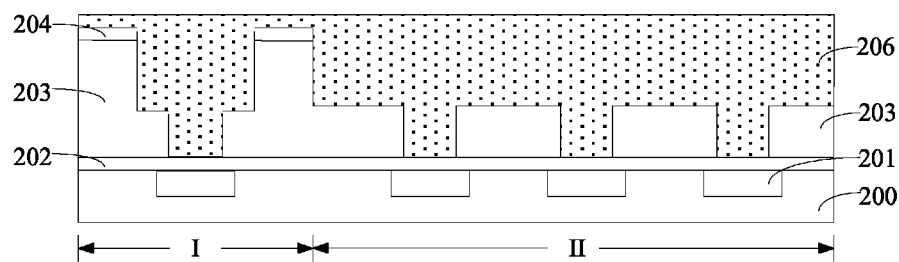

Referring to FIG. 5, polymer layer 206 is formed to fill through-holes 205 and to cover surface of the remaining portions of protective layer 204 and interlayer dielectric layer 203 (e.g., as shown in FIG. 4) in the first and second regions (e.g., in Step 1108).

Polymer layer 206 formed in the first region I and the second region II can be coplanar with one another. For example, more amount of polymer layer can be formed in the second region II than in the first region I. In one embodiment, polymer layer 206 can be formed, e.g., by a spin coating process.

Polymer layer 206 can have different dissolving characteristics in response to an exposure, e.g., from a photolithographic tool. For example, polymer layer 206 placed in an exposed area may be dissolved, while polymer layer 206 placed in a non-exposed area may not be dissolved; or vice versa.

In addition, polymer layer 206 can be selected that can be oxidized to form an oxide layer by an annealing process. In one embodiment, polymer layer 206 can be made of a material of hydrogen silsesquioxane (HSQ: $H_8Si_8O_{12}$).

In one embodiment, when selecting HSQ for forming polymer layer 206, HSQ can provide desired advantages. For example, HSQ has photoresist features. When exposed to e-beams or extreme ultraviolet (EUV) radiation, HSQ material in the exposed area can undergo cross-linking reactions. After a developing process, cross-linked HSQ material in the exposed areas can remain intact, while HSQ material in the non-exposed area can be dissolved in the developing process. In other words, HSQ material can have a negative photoresist characteristic.

Subsequently, vias can be formed by exposure and developing polymer layer 206, without using an etching process. Manufacturing process can thus be simplified. In addition, etching errors (deviations) can be avoided to increase accuracy in positioning the vias and thus to improve accuracy in positioning air gaps. Further, after a subsequent annealing process, HSQ material can be converted into a silicon oxide material which can be easily removed to allow a simple process to form air gaps.

Figure 6:
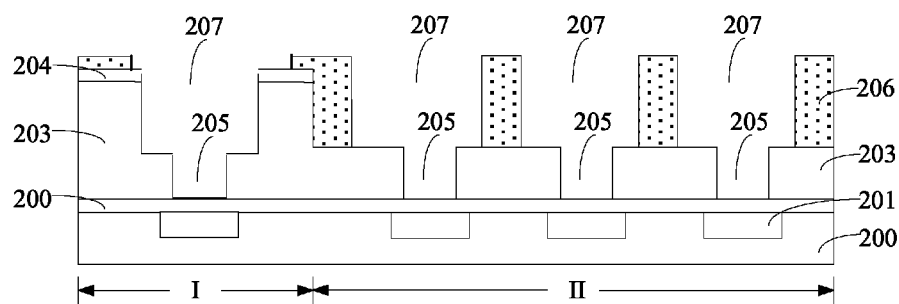

Referring to FIG. 6, polymer layer 206 can be exposed and then developed to form vias in the first and second regions (e.g., in Step 1110). As such, each via includes an upper via 207 and a lower via 205. Upper via 207 is on lower via 205 and has a width greater than lower via 205. The lower via 205 can be the same as the through-hole 205 in FIG. 4 after removal of polymer layers in the through-hole 205.

The vias can be formed, for example, by first exposing polymer layer 206 to an e-beam or EUV radiation, to define an exposed area and a non-exposed area. Polymer layer in the exposed area can be cross-linked, which may not be dissolved by a developing process. In contrast, polymer layer in the non-exposed area may not be cross-linked and may then be dissolved by the developing process. After the developing process, vias can be formed.

As such, vias each including the upper via 207 in the polymer layer 206 and the lower via 205 in the interlayer dielectric layer 203 as shown in FIG. 6, can be formed by exposure and developing processes, without using an etching process to polymer layer 206. Accuracy in forming vias can then be improved. Because subsequently-formed air gaps are formed adjacent to vias, air gaps can be formed with precise positioning.

Further, air gaps are formed by subsequent removal of polymer layer 206 remained in the second region II, (that is, a width of the second region II of the remaining polymer layer 206 is a width of air gaps to be formed), shapes, dimensions, and position of air gaps can be controlled by controlling the exposure process of polymer layer 206. For example, the width of remaining polymer layer 206 in the second region II may be adjusted by adjusting width of the exposed area and the non-exposed area. When increasing (or decreasing) the width of the non-exposed areas of polymer layer 206 in the second region II, air gaps with increased (or decreased) feature size can be controlled and obtained.

By forming vias in polymer layer 206, etching process and etching related errors can be avoided. This is different than a typical via-forming process, where patterns are transferred by a photolithography process to a mask layer to form a patterned mask layer, which is then used as an etch mask to form vias by an etching process. Such etching process may generate etching related errors and vias formed thereby (and thus air gaps) may not have desired, accurate positions/dimensions.

Figure 7:
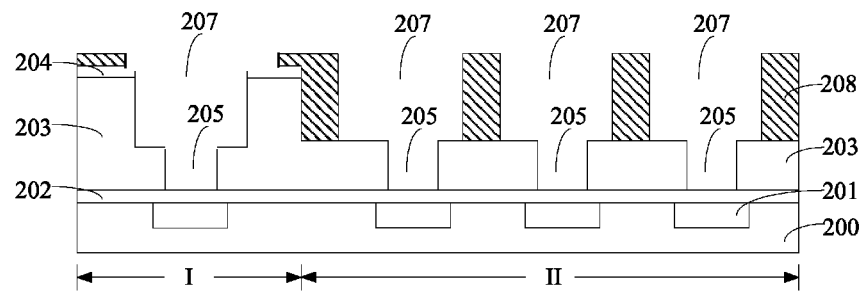

Referring to FIG. 7, the remaining polymer layer 206 in FIG. 6 is annealed to convert polymer layer 206 into oxide layer 208.

Polymers are often considered as soft matter. After subsequent formation of a second metal layer (e.g., layer 209 in FIG. 9), a chemical mechanical polishing (CMP) process may be applied to the second metal layer. When the second metal layer is disposed on soft surface of the polymer layer 206, the CMP process may cause deformation of polymer layer 206. Reliability and electrical properties of the resultant semiconductor device can be adversely affected.

To avoid the above problems, optionally, oxide layer 208 can be formed from remaining polymer layer 206 by an annealing process, after vias are formed. Compared with polymer layer 206, oxide layer 208 can provide improved stability and desired hardness to prevent occurrence of deformation. Reliability of the semiconductor device during a subsequent CMP process can be improved.

The annealing process can break and/or recombine covalent bond of the polymer material of polymer layer 206 to oxide layer 208. In one embodiment, the oxide layer 208 includes a silicon oxide material.

Note that removal process of polymeric materials (e.g., HSQ) is complex and often leaves residues, while removal of a non-polymeric inorganic material (e.g., silicon oxide) can be relatively simpler. In addition, etching selectivity ratio between a silicon oxide layer and a dielectric material layer is sufficiently high. This can allow a short-time removal of the oxide layer 208 without damaging interlayer dielectric layer 203 and the second metal layer (due to excessive etching). Electrical properties of the resultant semiconductor device can be improved.

In various embodiments, the annealing process can be a rapid thermal annealing (RTA), for example, at an annealing temperature of about 450° C. to about 800° C. for about 0.01 milliseconds to about 10 milliseconds. In other embodiments, the annealing process may be omitted after forming the vias.

Figure 8:
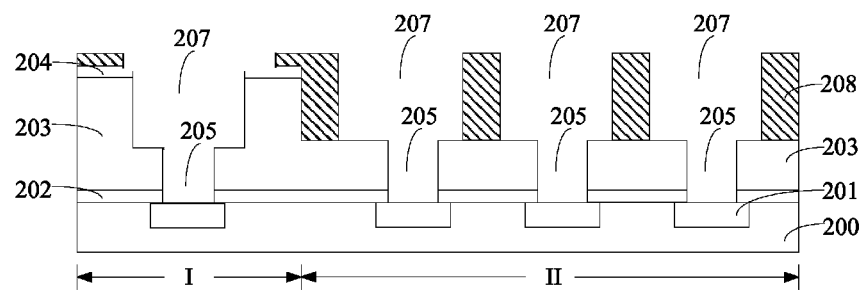

Referring to FIG. 8, the exposed portions of etch stop layer 202 is removed at the bottom of the via (in particular, the lower via 205) to expose at least a surface portion of first metal layer 201. The exposed first metal layers 201 can provide electrical connection with subsequently formed second metal layer. In one embodiment, etch stop layer 202 can be etched, e.g., by a dry etching process to remove the exposed portions thereof.

Figure 9:
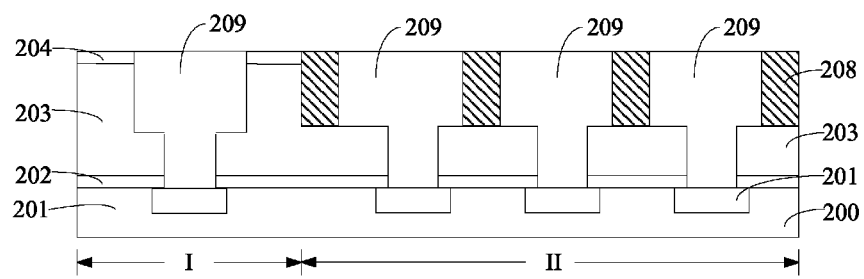

Referring to FIG. 9, vias are filled with metal material(s) to form second metal layers 209 (e.g., in Step 1112). Second metal layer 209 and the first metal layer 201 are electrically connected.

Second metal layer 209 can be formed by, e.g., first forming a metal film to fill the vias and to cover a surface of protective layer 204 in the first region I and oxide layer 208 in the second region II. A CMP process can be performed to remove the metal film in the first and second regions and to expose protective layer 204 in the first region I. For example, the CMP process can remove the metal film and a portion of oxide layer 208 in the second region II that are above the exposed protective layer 204, e.g., to form a flat or coplanar top surface for the semiconductor device as shown in FIG. 9. Second metal layers 209 are then formed in the vias in the second region II. As oxide layer 208 can provide sufficient hardness, oxide layer 208 can maintain intact during the CMP process.

Optionally, the CMP process can be further performed to remove the entire protective layer 204 and to provide a coplanar surface for second metal layers 209, interlayer dielectric layer 203, and oxide layer 208.

In various embodiments, second metal layer 209 can have a single layer structure or a multilayer structure. A single-layer structure of second metal layer 209 can include a bulk metal layer filled in the vias.

Optionally, a multilayer structure of second metal layer 209 can include a metal barrier layer (not shown) formed on interior surfaces of vias (including upper via 207 and lower via 205) and on the exposed first metal layer 201 at bottom of the vias. The multilayer structure of second metal layer 209 can further include a bulk metal layer formed on the metal barrier layer to completely fill the vias.

In an example when the multilayer structure is formed for second metal layers 209, the metal barrier layer can be used to prevent metal ions diffused from second metal layer 209 into interlayer dielectric layer 203 to improve performance of interconnect structure. In addition, the metal barrier layer can provide an interface for a desired adhesion between the metal barrier layer and second metal layer 209.

The metal barrier layer can be made of a material including, e.g., Ti, Ta, W, TiN, TaN, TiSiN, TaSiN, WN, WC, or a combination thereof. The metal barrier layer can be a single layer structure or a multilayer structure. The metal barrier layer can be formed by a chemical vapor deposition, a physical vapor deposition, and/or an atomic layer deposition.

The bulk metal layer of second metal layer can be made of a material including, e.g., W, Cu, Al, Ag, Pt, and/or any alloy thereof. The bulk metal layer can be a monolayer structure or a multilayer structure.

In one embodiment, the metal barrier layer can include a metal material Ta. The metal barrier layer can have a thickness ranging from about 10 Å to about 500 Å. The metal barrier layer can be formed by a physical vapor deposition. The bulk metal layer for second metal layer 209 can include Cu and can be formed by an electro-plating process.

Figure 10:
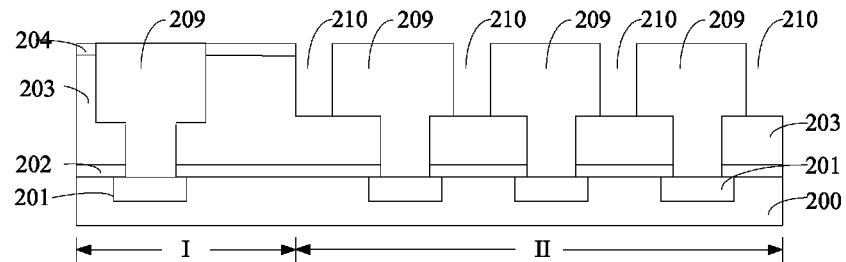
Figure 11:
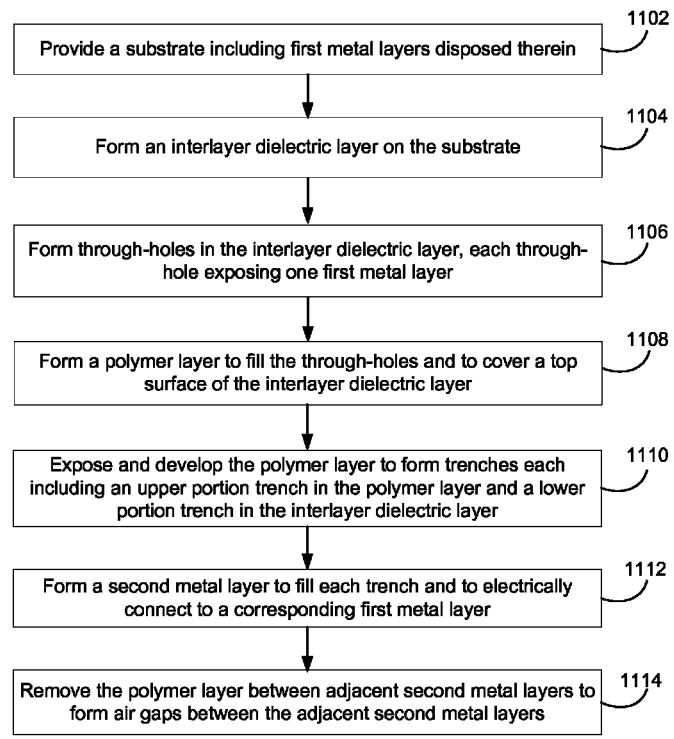
FIG. 11 depicts an exemplary method for forming an exemplary semiconductor device in accordance with various disclosed embodiments.

Referring to FIG. 10, oxide layer 208 between adjacent second metal layers 209 is removed, e.g., by a wet etching process, to form air gaps 210 (e.g., in Step 1114).

During the wet etching process, an etch rate for removing oxide layer 208 can be greater than an etch rate for removing interlayer dielectric layer 203. In an exemplary embodiment, the wet etching process can use an etching liquid of hydrofluoric (HF) acid solution having a volume ratio between hydrofluoric acid and deionized water of about 1:700 to about 1:300.

In an exemplary embodiment, a desired high etch selectivity ratio can be provide for the wet etching process, where interlayer dielectric layer 203 is a low-k or ultra-low-k dielectric material, and oxide layer 208 is silicon oxide. As such, when wet etching oxide layer 208, the wet etching process may have no adverse effect on interlayer dielectric layer 203. In addition, second metal layers 209 are made of metal material(s), which can also have high etch selectivity ratio over oxide layer 208. The wet etching process may not affect second metal layers 209.

Accordingly, the wet etching can substantially remove all oxide layer 208 between adjacent second metal layers 209 to form air gaps 210 between adjacent second metal layers 209, in particular, between upper metal layers. Each air gap 210 can have a width substantially same as the width between upper vias 207 formed as shown in FIG. 8. Compared with conventional air gaps, feature sizes of air gap 210 can be increased significantly. The dielectric constant k value of the semiconductor device and parasitic capacitance can be effectively reduced. RC delay effect, along with operating speed of the semiconductor device and electrical properties of the semiconductor device can be improved.

In this manner, each second metal layer 209 can have a lower metal layer in the interlayer dielectric layer 203 and an upper metal layer protruded over and disposed on a top surface of the interlayer dielectric layer 203. The lower metal layer of each second metal layer is electrically connected to one of first metal layers 201. Air gaps 210 are formed between adjacent second metal layers 209.

In other embodiments, after forming the vias and before forming the second metal layer, the annealing of the polymer layer may be omitted. In this case, after forming the second metal layer, a wet etching process can be used to remove polymer layer between adjacent second metal layers to form air gaps having a width between adjacent second metal layers. The air gaps can also have an increased feature size.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a semiconductor device, comprising:
   providing a substrate comprising a first region and a second region;
   providing first metal layers in the first region and the second region of the substrate, wherein the first metal layers have a top surface coplanar with a top surface of the substrate;
   forming an interlayer dielectric layer over the substrate, wherein the interlayer dielectric layer comprises a trench in the first region, and the interlayer dielectric layer in the second region has a top surface coplanar with a bottom of the trench in the first region;
   forming through-holes in the interlayer dielectric layer, each through-hole corresponding to one first metal layer in the first region and the second region;
   forming a polymer layer to fill the through-holes and the trench in the interlayer dielectric layer and to cover the top surface of the interlayer dielectric layer in the first and second regions, wherein the polymer layer has a different solubility in an exposed area and in a non-exposed area;
   exposing and developing the polymer layer to form vias, each including an upper via in the polymer layer and a lower via in the interlayer dielectric layer, wherein each via is formed on a corresponding first metal layer in the first and second regions;
   forming a second metal layer to fill each via and to electrically connect to the corresponding first metal layer; and
   removing the polymer layer between adjacent second metal layers to form air gaps between the adjacent second metal layers in the second region.

2. The method according to claim 1, further comprising selecting the polymer layer capable of being converted into an inorganic oxide layer after an annealing process.

3. The method according to claim 1, wherein the polymer layer comprises a polymer of hydrogen silsesquioxane.

4. The method according to claim 1, wherein forming the polymer layer comprises a spin coating process.

5. The method according to claim 1, wherein exposing and developing the polymer layer to form the vias comprises:
   exposing the polymer layer to define the exposed area and the non-exposed area, wherein the polymer layer in the exposed area undergoes a crosslinking reaction; and
   developing the polymer layer after the exposure, such that the polymer layer cross-linked in the exposed area remains, and the polymer layer in the non-exposed region is dissolved and removed to form the vias.

6. The method according to claim 1, wherein the polymer layer is exposed to an e-beam or extreme ultraviolet radiation.

7. The method according to claim 1, wherein the interlayer dielectric layer comprises a low-k dielectric material or an ultra-low-k dielectric material.

8. The method according to claim 1, further comprising forming an etch stop layer between the substrate and the interlayer dielectric layer, wherein the etch stop layer is made of a material including SiC, SiN, SiOC, SiCN, SiOCN, or a combination thereof.

9. The method according to claim 1, wherein the second metal layer comprises a single layer formed by filling a metal material in the vias.

10. The method according to claim 1, wherein the second metal layer comprises a double layer comprising a metal barrier layer formed on sidewall and bottom of each via including the upper potion via and the lower via; and a bulk metal layer formed on the metal barrier layer to fill each via, and wherein the metal barrier layer is made of a material comprising Ti, Ta, W, TiN, TaN, TiSiN, TaSiN, WN, WC, or a combination thereof.

11. The method according to claim 1, wherein each of the first metal layer and the second metal layer is made of a material comprising W, Cu, Al, Ag, Pt, or a combination thereof.

12. The method according to claim 1, further comprising annealing the polymer layer to form an oxide layer after forming the vias and before forming the second metal layer.

13. The method according to claim 12, wherein the annealing is a rapid thermal annealing at an annealing temperature of about 450° C. to about 800° C. for about 0.01 milliseconds to about 10 milliseconds.

14. The method according to claim 12, further comprising removing the oxide layer between the adjacent second metal layers to form the air gaps by a wet etching process.

15. The method according to claim 14, further comprising selecting a material for the polymer layer such that the oxide layer has an etch rate greater than the interlayer dielectric layer in the wet etching process.

16. A semiconductor device, comprising:
a substrate comprising a first region and a second region;
first metal layers disposed in the first and second regions, wherein the first metal layers have a top surface coplanar with a top surface of the substrate;
an interlayer dielectric layer disposed on the substrate; and
second metal layers disposed on corresponding first metal layers in the first and second regions, wherein each second metal layer has a lower metal layer through the interlayer dielectric layer and an upper metal layer protruded over and disposed on a top surface of the interlayer dielectric layer,
wherein air gaps are formed between adjacent second metal layers in the second region by: forming through-holes in the interlayer dielectric layer, each through-hole corresponding to one first metal layer in the first region and the second region, the interlayer dielectric layer further comprising a trench in the first region; forming a polymer layer to fill the through-holes and the trench in the interlayer dielectric layer and to cover the top surface of the interlayer dielectric layer in the first and second regions, wherein the polymer layer has a different solubility in an exposed area and in a non-exposed area; exposing and developing the polymer layer to form vias, each including an upper via in the polymer layer and a lower via in the interlayer dielectric layer, wherein each via is formed on a corresponding first metal layer in the first and second regions; forming a second metal layer to fill each via and to electrically connect to the corresponding first metal layer; and removing the polymer layer between adjacent second metal layers to form air gaps between the adjacent second metal layers in the second region.

17. The device according to claim 16, wherein the upper metal layer of the second metal layer has a width greater than the lower metal layer of the second metal layer.

18. The device according to claim 16, wherein the polymer layer is capable of being converted into an inorganic oxide layer by annealing.

19. The device according to claim 16, wherein the polymer layer comprises a polymer of hydrogen silsesquioxane.

20. The device according to claim 16, further comprising an etch stop layer disposed between the substrate and the interlayer dielectric layer, wherein the etch stop layer is made of a material including SiC, SiN, SiOC, SiCN, SiOCN, or a combination thereof.

* * * * *